(12) United States Patent
Papavasiliou et al.

(10) Patent No.: US 8,826,514 B2
(45) Date of Patent: Sep. 9, 2014

(54) MICROFABRICATED INDUCTORS WITH THROUGH-WAFER VIAS

(75) Inventors: Alexandros Papavasiliou, Thousand Oaks, CA (US); Jeffrey F. DeNatale, Thousand Oaks, CA (US); Philip A. Stupar, Oxnard, CA (US); Robert L. Borwick, III, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 744 days.

(21) Appl. No.: 13/027,150

(22) Filed: Feb. 14, 2011

(65) Prior Publication Data

US 2011/0131798 A1 Jun. 9, 2011

Related U.S. Application Data

(62) Division of application No. 12/398,942, filed on Mar. 5, 2009, now abandoned.

(51) Int. Cl.
*H01F 41/04* (2006.01)
*H01F 41/10* (2006.01)
*H01F 17/00* (2006.01)

(52) U.S. Cl.
CPC .... *H01R 17/0013* (2013.01); *H01F 2017/0086* (2013.01)
USPC .............. 29/602.1; 29/606; 29/852; 336/200; 336/219; 336/221; 336/234; 427/97.9; 427/116

(58) Field of Classification Search
USPC ........ 29/602.1, 604, 606, 831, 840, 852, 854; 336/177, 200, 219, 221, 234; 427/97.9, 427/116, 117
See application file for complete search history.

(56) References Cited

U.S. PATENT DOCUMENTS

| | | | | |
|---|---|---|---|---|
| 5,477,204 A | * | 12/1995 | Li | 336/200 |
| 6,148,500 A | * | 11/2000 | Krone et al. | 29/602.1 |
| 7,107,666 B2 | * | 9/2006 | Hiatt et al. | 29/602.1 |

FOREIGN PATENT DOCUMENTS

JP 55008363 A * 1/1980

* cited by examiner

*Primary Examiner* — A. Dexter Tugbang
(74) *Attorney, Agent, or Firm* — Snell & Wilmer LLP

(57) ABSTRACT

Microfabricated inductors with through-wafer vias and including a first wafer and a second wafer, each wafer having a plurality of metal fillings therein, and a plurality of metal conductors connecting the plurality of metal fillings together to form a spiral. A method for producing an inductor including steps of forming a first plurality of vias in a first substrate, filling the first plurality of vias in the first substrate with a first plurality of metal fillings, forming a first plurality of metal conductors, connecting pairs of the first plurality of metal fillings together using the first plurality of metal conductors to form a spiral, performing the foregoing steps similarly on a second substrate formed with a second plurality of vias filled with a second plurality of metal fillings, and bonding the first substrate with the second substrate.

16 Claims, 13 Drawing Sheets

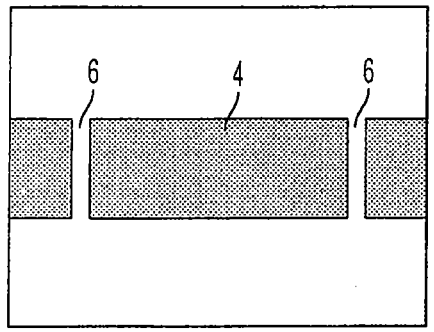
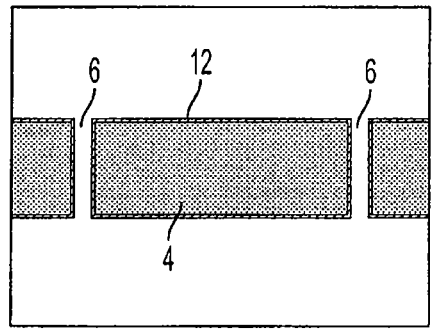
FIG. 4  FIG. 5
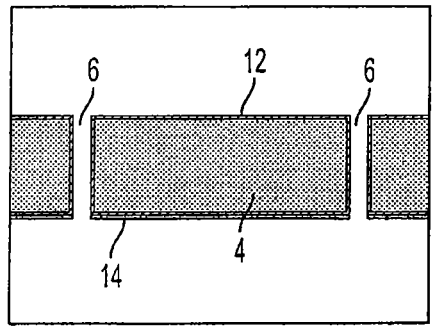
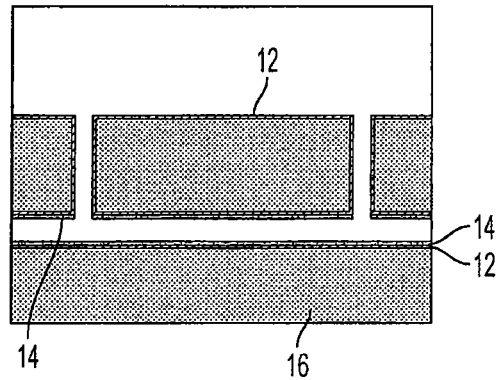
FIG. 6  FIG. 7

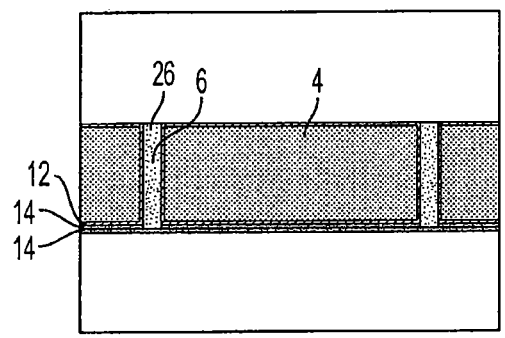
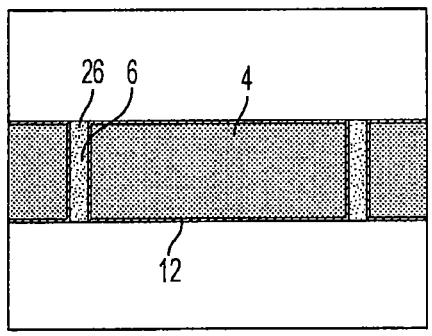
FIG. 12  FIG. 13
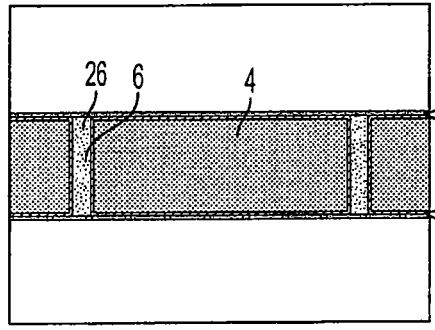
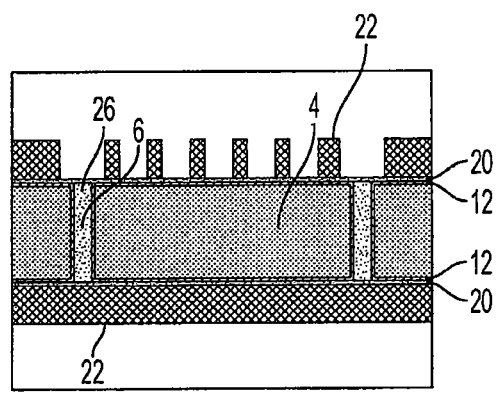
FIG. 14  FIG. 15

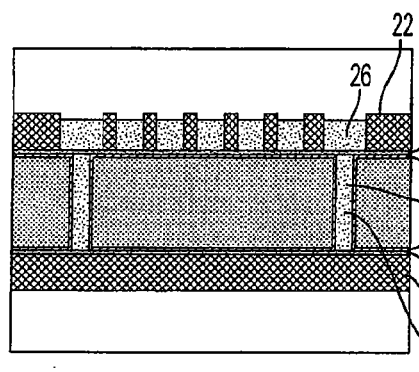
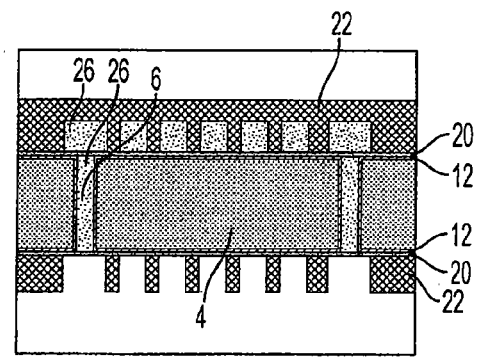
FIG. 16          FIG. 17
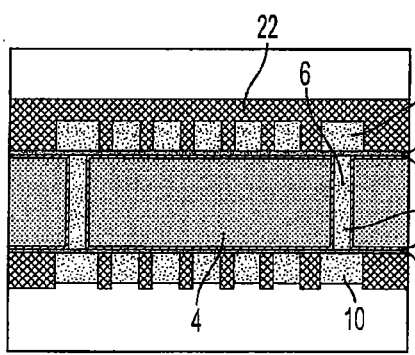
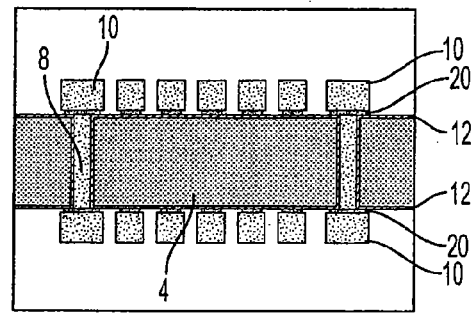
FIG. 18          FIG. 19

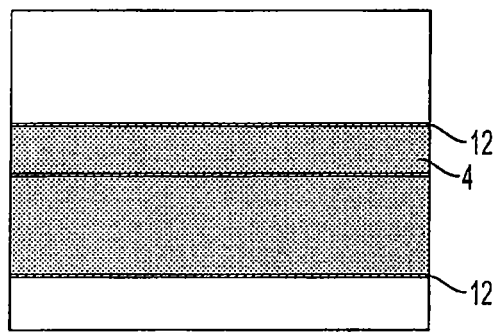
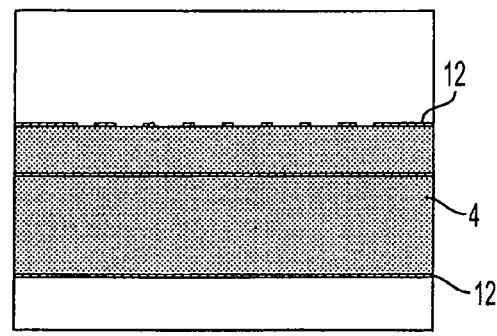
FIG. 20              FIG. 21
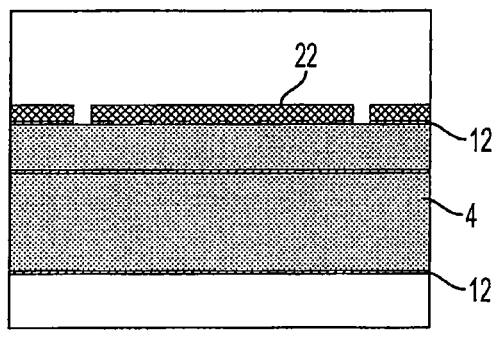
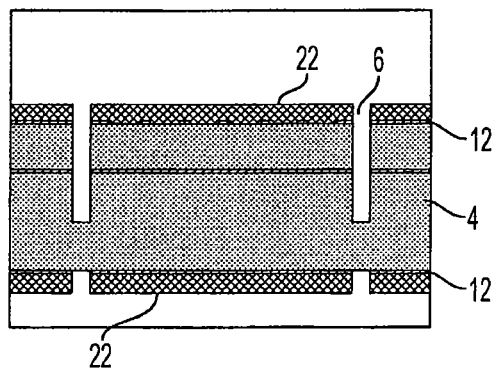
FIG. 22              FIG. 23

MICROFABRICATED INDUCTORS WITH THROUGH-WAFER VIAS

CLAIM OF BENEFIT UNDER 35 U.S.C. §§120 and 121

This application is a divisional of and claims the benefit and priority of U.S. patent application Ser. No. 12/398,942, entitled "MICROFABRICATED INDUCTORS WITH THROUGH-WAFER VIAS," filed on Mar. 5, 2009. The entire disclosure of the parent application is incorporated by reference herein.

BACKGROUND

1. Field

The present invention relates to microfabricated inductors with through-wafer vias.

2. Related Art

RF systems often use inductors. However, conventional inductors with an air center require a large amount of physical space and may also have a relatively low Q factor. This can place a limit or hamper the ability of reducing the size of RF systems. Furthermore, the relatively low Q factor can reduce the performance of RF systems at high frequencies.

Thus, there is a need for inductors which occupy a reduced amount of space and possess an improved Q factor.

SUMMARY

In one embodiment, the present invention is an inductor including a first wafer, a first plurality of metal fillings located within the first wafer, and a first plurality of metal conductors connecting the first plurality of metal fillings together to form a first spiral with a first plurality of windings.

In another embodiment, the present invention is an inductor including a first wafer, a first plurality of metal fillings located within the first wafer, a first plurality of metal conductors connecting pairs of the first plurality of metal fillings together to form a first portion of a first spiral. The present invention also includes a second wafer, a second plurality of metal fillings located within the second wafer, and a second plurality of metal conductors connecting pairs of the second plurality of metal fillings together to form a second portion of the first spiral. The first portion of the first spiral and the second portion of the first spiral can be bonded together to form the first spiral.

In yet another embodiment, the present invention is a method for producing an inductor including the steps of forming a first plurality of vias in a first substrate, filling the first plurality of vias in the first substrate with a first plurality of metal fillings, forming a first plurality of metal conductors, and connecting pairs of the first plurality of metal fillings together using the first plurality of metal conductors to form a spiral.

BRIEF DESCRIPTION OF THE DRAWINGS

The features, objects, and advantages of the present invention will become more apparent from the detailed description set forth below when taken in conjunction with the drawings, wherein:

FIG. 4 is a side view of a production of an embodiment of the present invention;

FIG. 5 is a side view of a production of an embodiment of the present invention;

FIG. 6 is a side view of a production of an embodiment of the present invention;

FIG. 7 is a side view of a production of an embodiment of the present invention;

FIG. 12 is a side view of a production of an embodiment of the present invention;

FIG. 13 is a side view of a production of an embodiment of the present invention;

FIG. 14 is a side view of a production of an embodiment of the present invention;

FIG. 15 is a side view of a production of an embodiment of the present invention;

FIG. 16 is a side view of a production of an embodiment of the present invention;

FIG. 17 is a side view of a production of an embodiment of the present invention;

FIG. 18 is a side view of a production of an embodiment of the present invention;

FIG. 19 is a side view of a production of an embodiment of the present invention;

FIG. 20 is a side view of a production of an alternate embodiment of the present invention;

FIG. 21 is a side view of a production of an alternate embodiment of the present invention;

FIG. 22 a side view of a production of an alternate embodiment of the present invention;

FIG. 23 a side view of a production of an alternate embodiment of the present invention;

DETAILED DESCRIPTION

Methods and systems that implement the embodiments of the various features of the present invention will now be described with reference to the drawings. The drawings and the associated descriptions are provided to illustrate embodiments of the present invention and not to limit the scope of the present invention. Reference in the specification to "one embodiment" or "an embodiment" is intended to indicate that a particular feature, structure, or characteristic described in connection with the embodiment is included in at least an embodiment of the present invention. The appearances of the phrase "in one embodiment" or "an embodiment" in various places in the specification are not necessarily all referring to the same embodiment. Throughout the drawings, reference numbers are re-used to indicate correspondence between referenced elements.

Figure 1:
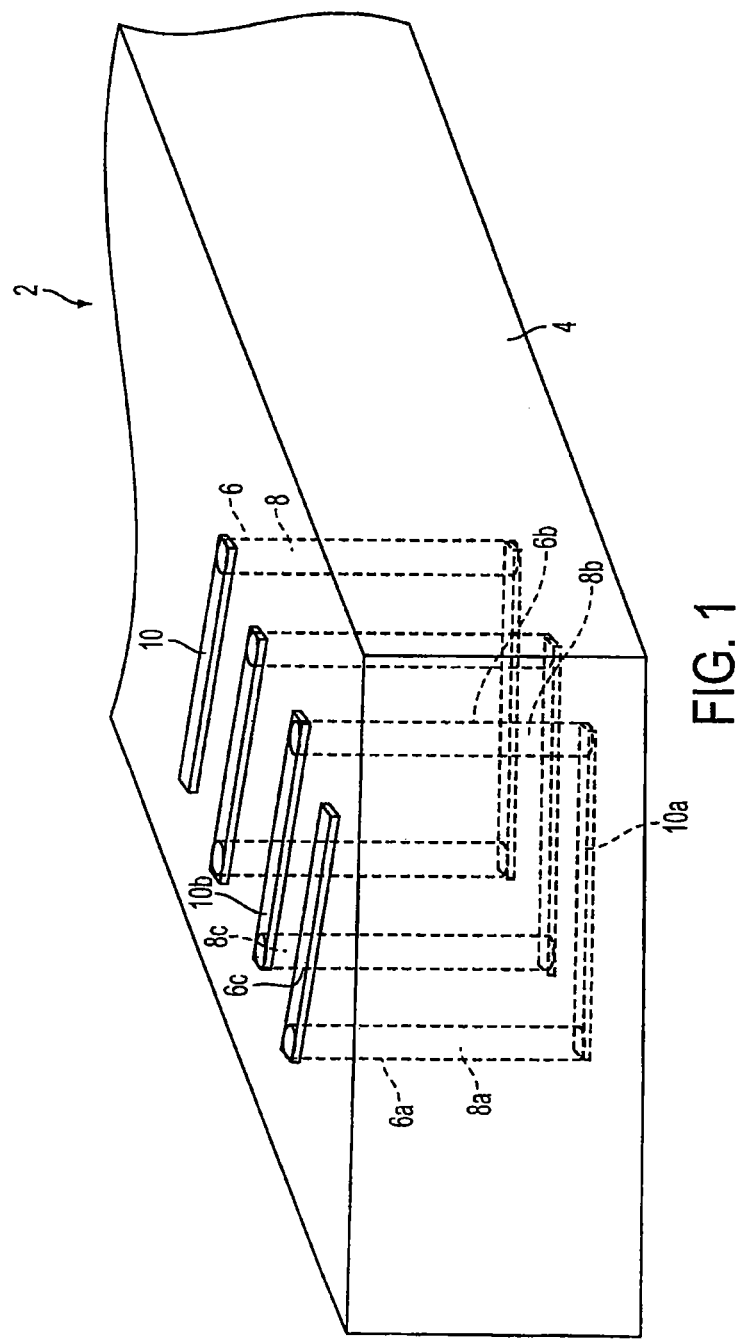
FIG. 1 is a perspective view of an embodiment of the present invention.
Figure 2:
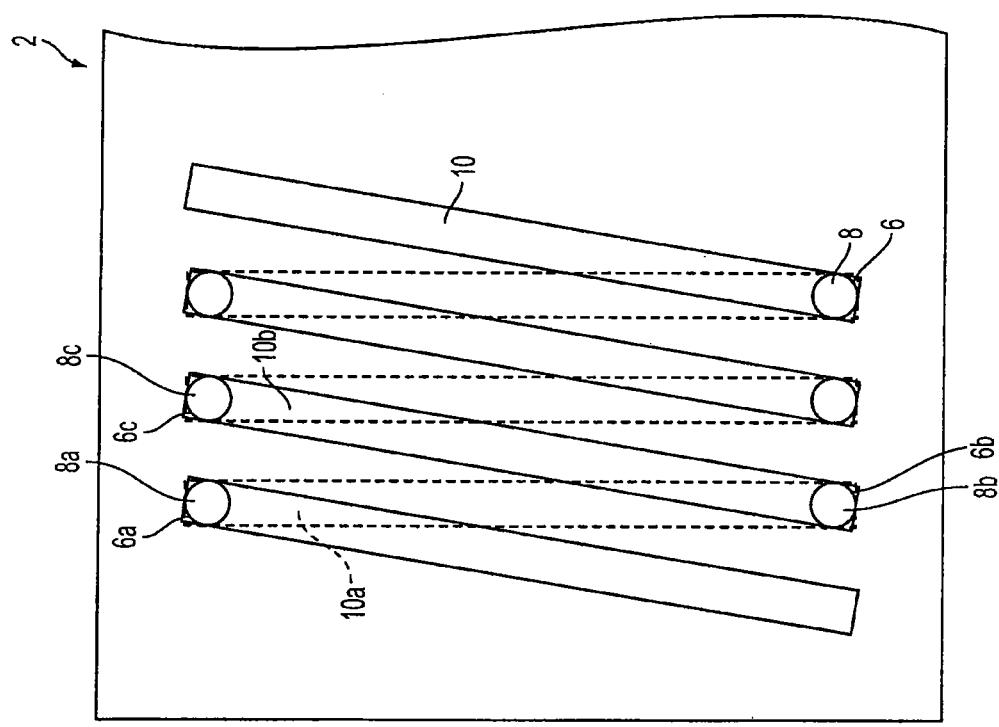
FIG. 2 is a top view of an embodiment of the present invention.

FIG. 1 is a perspective view of an embodiment of the present invention while FIG. 2 is a top view of an embodiment of the present invention depicted in FIG. 1. As shown in FIG. 1 and FIG. 2, an inductor 2 is formed within a substrate 4. Substrate 4 can be formed, for example, from silicon (Si), insulators, a combination of silicon and insulators, and/or any other type of material suitable to form a core for an inductor. Substrate 4 can be a silicon wafer, or a silicon on insulator (SOI) wafer. Substrate 4 can, for example, be between approximately 100 μm to approximately 1000 μm thick. In one embodiment, substrate 4 is approximately 400 μm thick.

Inductor 2 includes a plurality of vias 6 which can be filled with metal fillings 8. The metal fillings 8 can be connected by conductors 10. Metal fillings 8 and conductors 10 can form windings and/or loops within substrate 4. The metal fillings 8 can be, for example, copper (Cu), copper alloys, silver (Ag), silver alloys, or any other types of conductive metal. Conductor 10 can also be copper (Cu), copper alloys, silver (Ag), silver alloys, or any other types of conductive metal. In one embodiment, metal fillings 8 and conductor 10 are formed from the same type of conductive metal. In another embodiment, metal fillings 8 and conductor 10 are formed from different types of conductive metal. The conductors 10 can be formed on a surface of the substrate 4.

A current can flow, for example, into metal filling 8a, from metal filling 8a to conductor 10a, from conductor 10a to metal filling 8b, from metal filling 8b to conductor 10b, from conductor 10b to metal filling 8c, and so on such that the metal current traverses the loops formed by metal fillings 8 and conductors 10 within substrate 4.

Since inductor 2 is formed within substrate 4, inductor 2 can utilize less space. Inductor 2 can be 10 times smaller in each of three dimensions, thickness, width, and length when compared with a conventional inductor with an air center. Thus, inductor 2 can be approximately 1,000 times smaller than conventional inductors formed with wires, such as conventional inductors with air centers.

Figure 3:
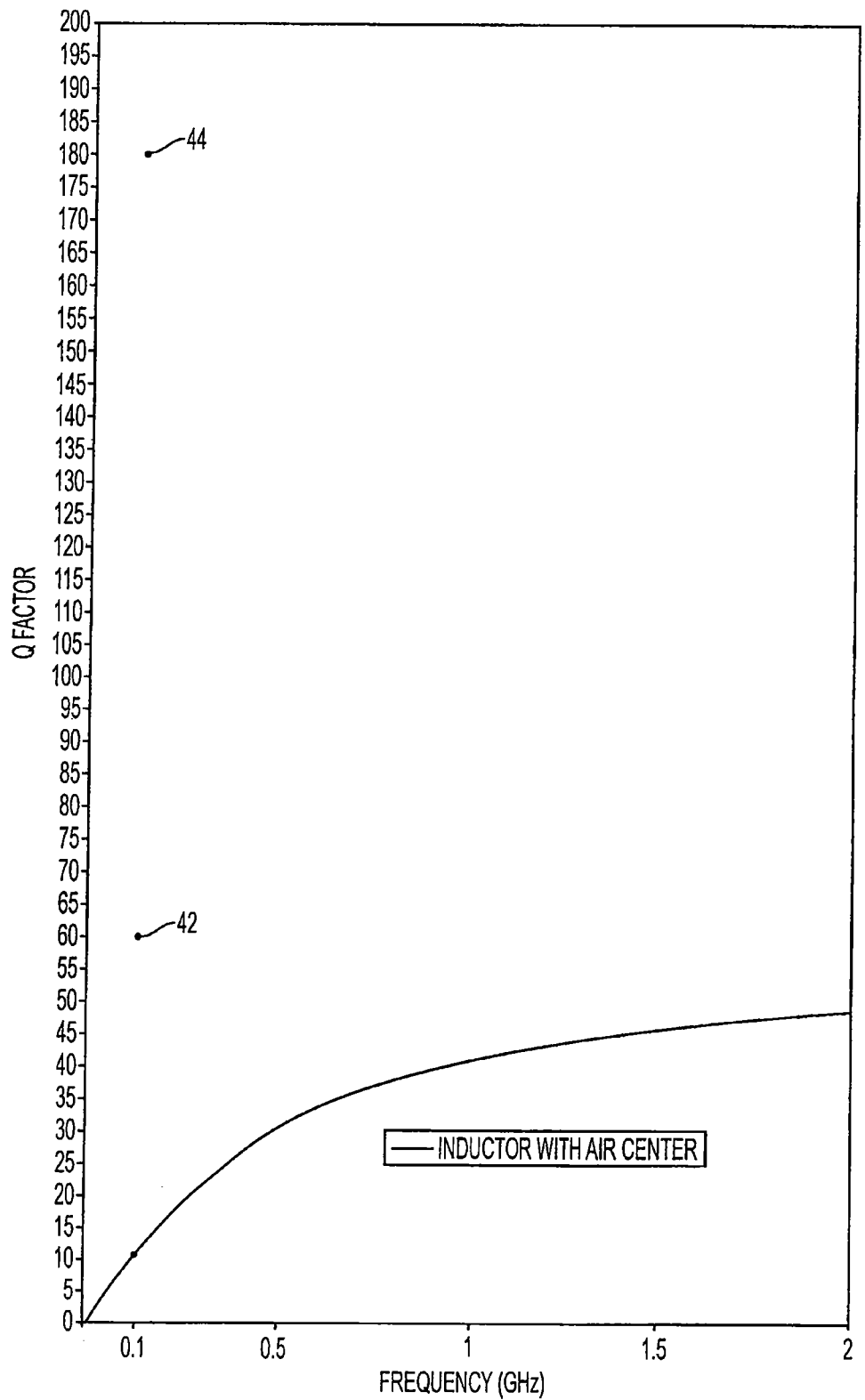
FIG. 3 is a graph of Q factors.

FIG. 3 is a graph of Q factors. The Q factor for inductors is governed by the equation $$Q = \frac{\omega L}{R}$$

where R is the inductor's internal electrical resistance and $\omega L$, is the inductor's capacitive or inductive reactance at resonance.

As seen in FIG. 3, although the Q of a silicon-core inductor may not be as high as that of an air-core inductor at high frequencies, the Q of the inductor of the present invention is comparable to the Q of an air-core inductor at frequencies less than approximately 500 MHz. The present invention may be particularly valuable for applications below 500 MHz where the present invention can be used without compromising the Q. As seen in FIG. 3 at 0.1 GHz, the Q factor of the inductors with air centers can have a Q of approximately 10. In contrast, in one embodiment of the present invention, the Q factor of inductor 2 is 60 at 0.1 GHz as indicated by point 42. In another embodiment of the present invention, the Q factor of inductor 2 is 180 at 0.1 GHz as indicated by point 44.

FIG. 19 is a side view of an embodiment of the present invention. FIGS. 4 to 18 are side views of a production of an embodiment of the present invention disclosed in FIG. 19. As shown in FIG. 4, vias 6 are etched in substrate 4. Substrate 4 can have a first side and a second side. In FIG. 4, the first side is a top side of substrate 4 while the second side is a bottom side of substrate 4. In FIG. 5, substrate 4 is coated with an insulation layer 12. Insulation layer 12 can be, for example, Parylene, silicon oxide ($SiO_2$), or any other type of suitable insulation material. To coat insulation layer 12 on substrate 4, substrate 4 can be thermally oxidized or insulation layer 12 can be coated by performing deep reactive ion etching using a time sequenced etch and passivation process, such as the Bosch process, on substrate 4.

Figure 8:
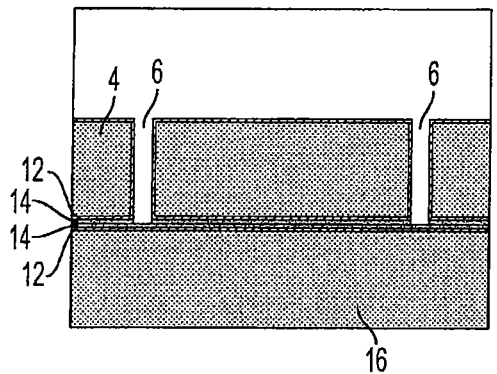
FIG. 8 is a side view of a production of an embodiment of the present invention.
Figure 9:
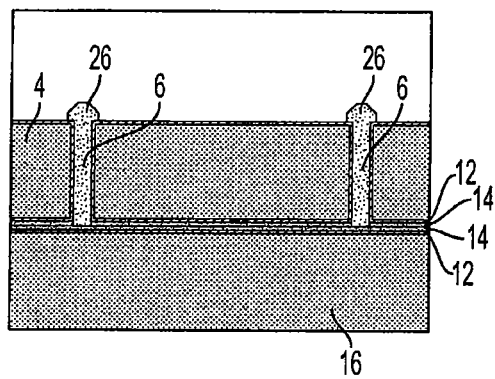
FIG. 9 is a side view of a production of an embodiment of the present invention.

In FIG. 6, gold layer 14 is evaporated on the second side of substrate 4. In FIG. 7, gold layer 14 is deposited on insulation layer 12 of a dummy wafer 16. Gold layer 14 can be deposited on insulation layer 12 of dummy wafer 16 through evaporation. Dummy wafer 16 can be formed, for example, from silicon 4. In FIG. 8, dummy wafer 16 is bonded to substrate 4 through gold layer 14 for both substrate 4 and dummy wafer 16. In FIG. 9, a metal 26 is used to fill vias 6. Metal 26 can be, for example, copper, silver, nickel or any other metal with a relatively high conductivity such as the metal used for metal fillings 8. Furthermore, metal 26 can be filled in vias 6 by electroplating metal 26 through vias 6.

Figure 10:
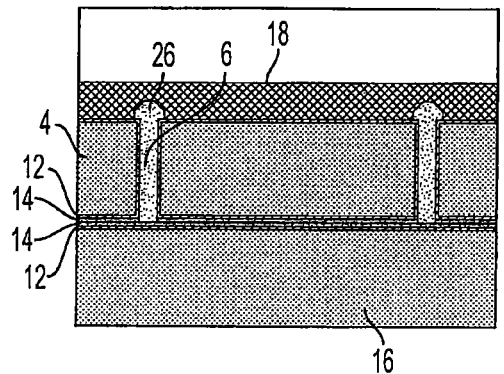
FIG. 10 is a side view of a production of an embodiment of the present invention.
Figure 11:
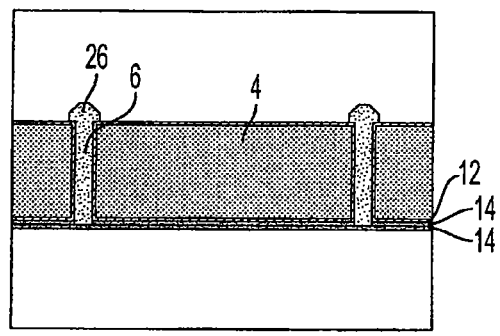
FIG. 11 is a side view of a production of an embodiment of the present invention.

In FIG. 10, photoresist 18 is placed over the first side of substrate 4 encompassing metal 26 and insulation layer 12. Photoresist 18 provides protection for substrate 4 and the layers of materials between substrate 4 and photoresist 18 such as metal 26 and/or insulation layer 12. In FIG. 11, dummy wafer 16 is removed along with photoresist 18. The removal of photoresist 18 exposes metal 26 and insulation layer 12 on the first side of substrate 4. Dummy wafer 16 can be removed by grinding and etching dummy wafer 16. After dummy wafer 16 is removed, insulation layer 12 which was located on the second side of substrate 4 between dummy wafer 16 and gold layer 14 is also removed through etching.

In FIG. 12, metal 26 that juts above substrate 4 and insulation layer 12 on the first side of substrate 4 is removed through polishing. In FIG. 13, both gold layers 14 are removed. Also, metal 26 that juts above substrate 4 and insulation layer 12 on the second side of substrate 4 is also removed. In FIG. 14, seed layer 20 is deposited on both sides of substrate 4. Seed layer 20 can be, for example, copper, gold (Au), or any other suitable material to form conductors 10. In one embodiment, seed layer 20 can be between approximately 200 Å to approximately 3000 Å. In another embodiment, seed layer 20 is approximately 1000 Å.

In FIG. 15, photoresist 22 is layered on both sides of substrate 4. The layer of photoresist 22 on a first side of substrate 4 is patterned with holes where conductors 10 are formed. In FIG. 16, metal 26 is deposited in the holes, created during the patterning of photoresist 22, on the first side of substrate 4. Metal 26 can be deposited in the holes created during the patterning of photoresist 22, for example, through electroplating. In FIG. 17, the layer of photoresist 22 that was patterned in FIG. 15 is overlayed with photoresist covering up the holes. The layer of photoresist 22 on the second side of substrate 4 is now patterned with holes where conductors 10 will be formed. In FIG. 18, metal 26 is filled in the holes of the layer of photoresist 22 on the second side of substrate 4. In FIG. 19, the layers of photoresist 22 and seed layer 20 on both sides of substrate 4 are removed to form inductor 2 with substrate 4, metal fillings 8 and conductors 10. With the embodiment depicted in FIG. 19, inductor 2 can have a Q of approximately 60.

Figure 34:
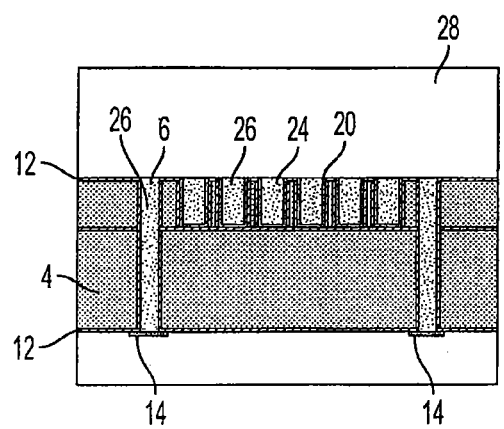
FIG. 34 a side view of a production of an alternate embodiment of the present invention.
Figure 35:
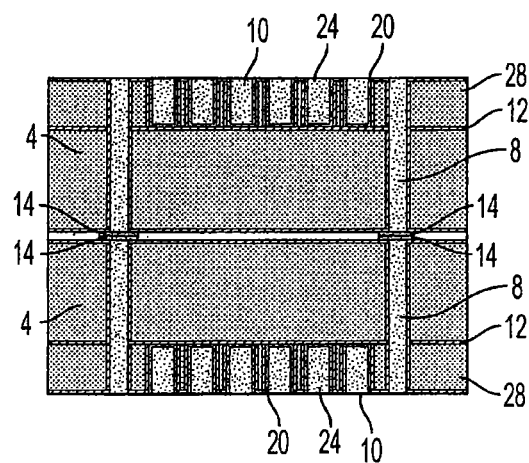
FIG. 35 is a side view of an alternate embodiment of the present invention.

FIG. 35 is a side view of an alternate embodiment of the present invention. FIGS. 20 to 34 are side views of a production of an embodiment of the present invention disclosed in FIG. 35. In FIG. 20, a first substrate 4 is coated with insulation layer 12. In FIG. 35, the first substrate 4 is an SOI substrate with a first side and a second side. In FIG. 21, insulation layer 12 is patterned on one side of substrate 4 including forming holes on insulation layer 12 on the first side of the first substrate 4. In FIG. 22, the patterned insulation layer 12 on the first side is coated with photoresist 22. A pattern is created on photoresist 22 including holes above locations on the first substrate 4 where vias 6 should be created on the first substrate 4.

Figure 24:
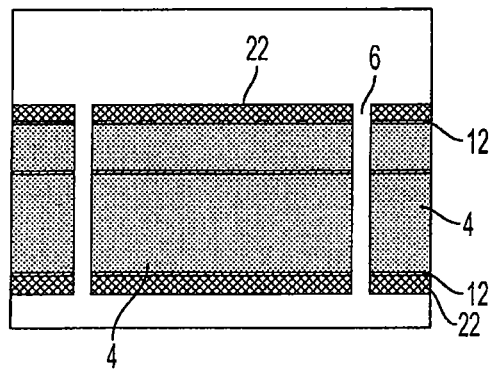
FIG. 24 a side view of a production of an alternate embodiment of the present invention.
Figure 25:
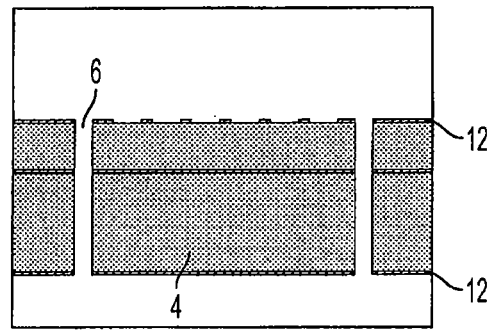
FIG. 25 a side view of a production of an alternate embodiment of the present invention.

In FIG. 23, holes are etched in substrate 4 where vias 6 should be formed. In addition, a layer of photoresist 22 is deposited on the second side of the first substrate 4. The layer of photoresist 22 on the second side of the first substrate 4 is patterned and holes are created in the layer of photoresist 22 corresponding to the location of vias 6. In FIG. 24, holes are etched completely through the first substrate 4 to form vias 6. In FIG. 25, photoresist 22 is removed on both the first side and the second side of the first substrate 4 exposing the patterned insulation layer 12 on both the first side and the second side of substrate 4.

Figure 26:
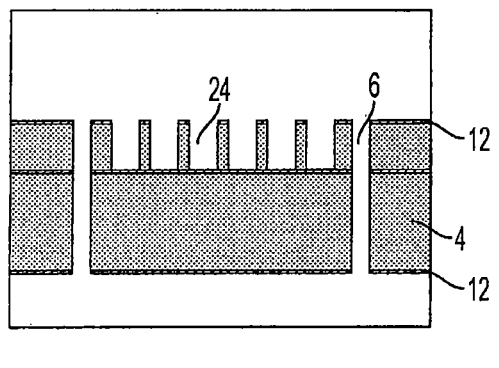
FIG. 26 a side view of a production of an alternate embodiment of the present invention.

In FIG. 26, trenches 24 are formed in the first substrate 4 by etching the first substrate 4 at locations corresponding to the holes of the patterned insulation layer 12. The trenches 24 can be formed using deep reactive ion etching according to a time sequenced etch and passivation chemistry such as the Bosch process. By forming the trenches through deep reactive ion etching, rather than for example, using molds formed by photoresist, a closer packing of the trenches may be achieved. An aspect ratio of a depth of the trenches 24 to spacing between trenches 24 can be increased, for example, the aspect ratio can be equal to or greater than 2:1, such as 10:1. The larger aspect ratio increases an amount of metal fillings and metal conductors per area thus increasing the winding density, or the amount of windings per area, of the inductor 2. With a higher winding density, an inductance of the inductor 2 can be improved. The closer packing of the trenches 24 can thus improve the performance of inductor 2.

Figure 27:
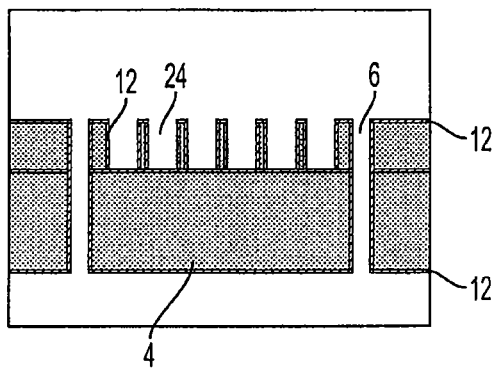
FIG. 27 a side view of a production of an alternate embodiment of the present invention.
Figure 28:
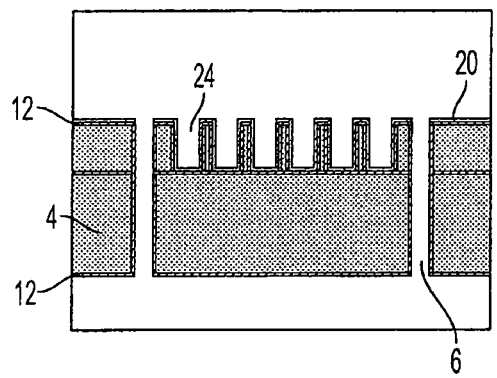
FIG. 28 a side view of a production of an alternate embodiment of the present invention.
Figure 29:
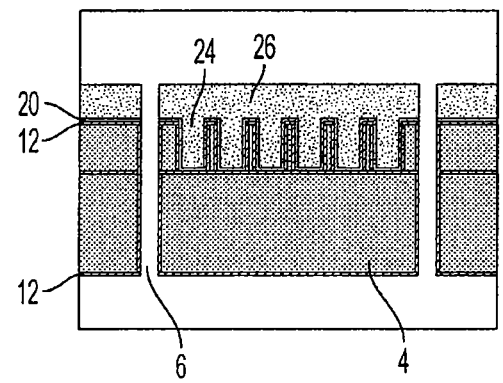
FIG. 29 a side view of a production of an alternate embodiment of the present invention.

In FIG. 27, insulation layer 24 is placed inside trenches 24. Insulation layer 24 can be placed, for example, inside trenches 24 through oxidizing the first substrate 4. In FIG. 28, seed layer 20 is sputtered on the first side of the first substrate 4. In FIG. 29, metal 26 is plated on the first side of the first substrate 4.

Figure 30:
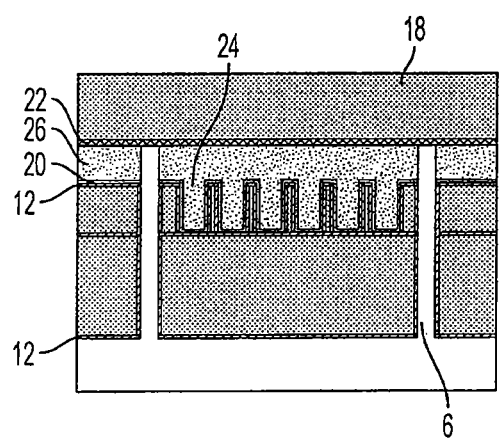
FIG. 30 a side view of a production of an alternate embodiment of the present invention.
Figure 31:
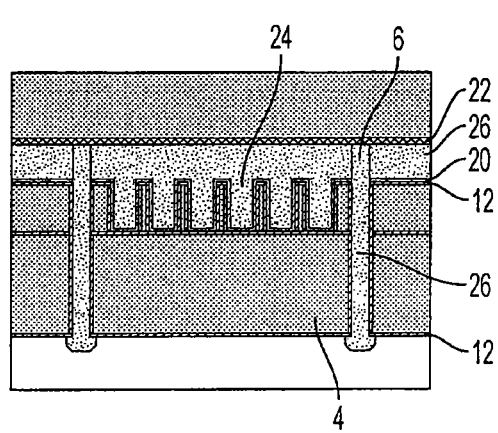
FIG. 31 a side view of a production of an alternate embodiment of the present invention.
Figure 32:
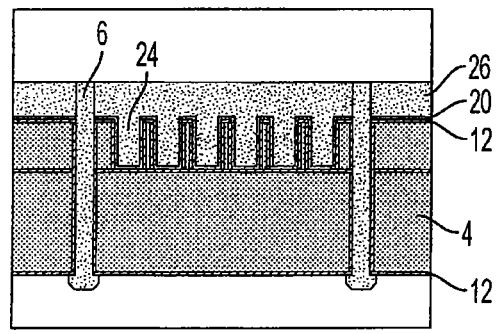
FIG. 32 a side view of a production of an alternate embodiment of the present invention.
Figure 33:
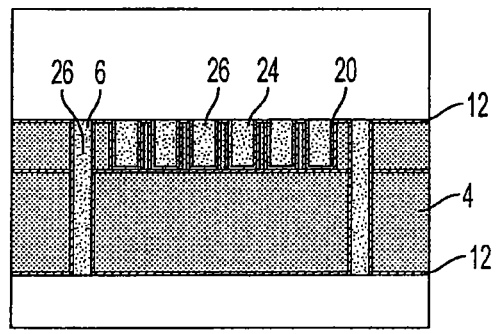
FIG. 33 a side view of a production of an alternate embodiment of the present invention.

In FIG. 30, dummy wafer 18 is resist bonded onto metal 26 using photoresist 26 on the first side of the first substrate 4. In FIG. 31, metal 26 is used to fill vias 6. Metal 26 can fill vias 6, for example, through electroplating. In FIG. 32, dummy wafer 18 is removed along with photoresist 22. In FIG. 33, excess metal 26 is removed from both the first side and the second side of the first substrate 4. Furthermore, both the first side and the second side of the first substrate 4 can be polished. In FIG. 34, gold layer 14 is deposited on an end of metal 26 in via 6 on the second side of the first substrate 4. In FIG. 35, the process depicted in FIGS. 20 to 34 is repeated for a second substrate 4. The second substrate 4, which has gone through the process depicted in FIGS. 20 to 34, is bonded with the first substrate 4 using a gold thermocompression bond at gold layers 14 to form inductor 2. Gold layers 14 can be, for example, gold bumps. With the embodiment depicted in FIG. 35, simulations have shown that inductor 2 can have a Q as high as 180. Although gold is used, other ductile metals can be used and the first substrate and the second substrate can be bonded with ductile metal bumps.

In both the embodiment depicted in FIG. 35 and the embodiment depicted in FIG. 19, metal fillings 8 and/or conductors 10 can be advantageously formed in a rectangular or elliptical shape in cross section. By having metal fillings 8 and/or conductors 10 formed in a rectangular or elliptical structure, they can be packed closer while taking up the same area thus increasing a winding density of the inductor 2 over conventional inductors. Conversely, with the same winding density, that is, the same amount of metal fillings 8 and/or conductors 10 per area, there is more current passing through the metal fillings 8 and/or conductors 10 due to the skin-effect. That is, the skin-effect drives the current to an outside edge of conductive materials. Rectangles and/or ovals beneficially have larger outside edges per unit area which thus reduces an amount of resistance in metal fillings 8 and/or conductors 10 and increases the amount of current passing through metal fillings 8 and/or conductors 10.

Figure 36:
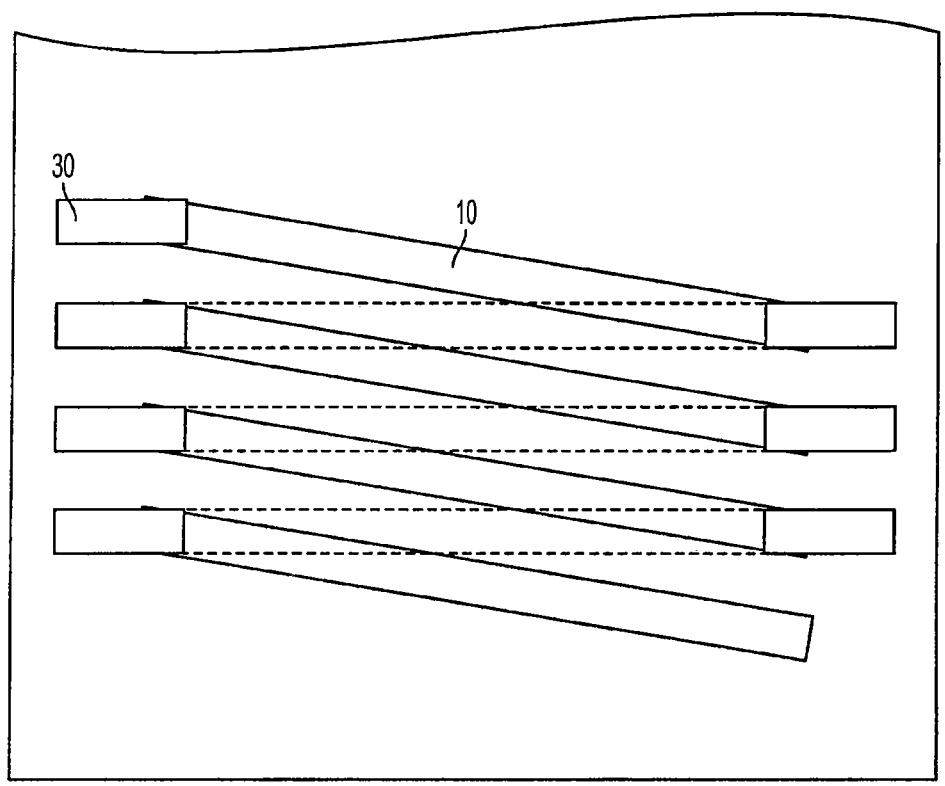
FIG. 36 is a top view of an alternate embodiment of the present invention.

FIG. 36 is a top view of an alternate embodiment of the present invention. In FIG. 36, metal fillings 30 have a larger width than metal fillings 8 disclosed in FIG. 1. In FIG. 36, metal fillings 30 have a rectangular shape in cross section, but metal fillings 30 can have any shape such as circular, oval, triangular, etc. By increasing the width of the metal fillings, the resistance of inductor 2 is decreased. Since the Q factor is governed by the equation $$Q = \frac{\omega L}{R}$$

where R is the inductor's internal electrical resistance and ωL is the inductor's capacitive or inductive reactance at resonance, any decrease in the amount of resistance results in an overall increase in the Q factor.

Figure 37:
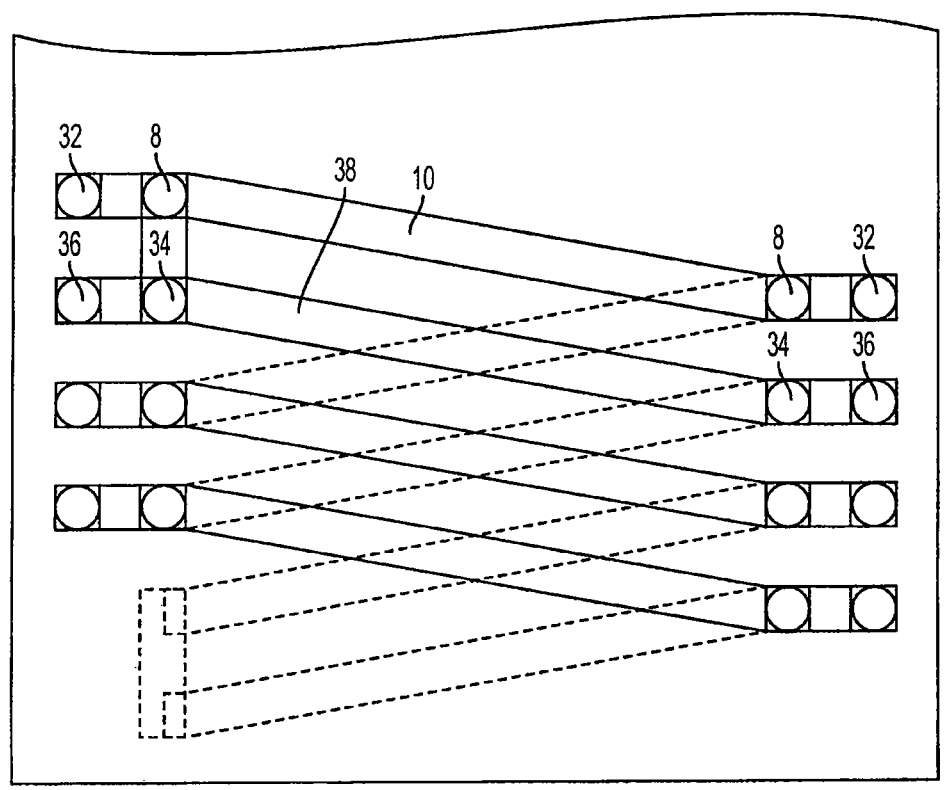
FIG. 37 is a top view of an alternate embodiment of the present invention.

FIG. 37 is a top view of an alternate embodiment of the present invention. FIG. 37 includes metal fillings 34 and metal contacts 38 which are connected in parallel to metal fillings 8 and metal contacts 10. By doing so, two inductors can be sandwiched into an area for a single inductor. However, since the two inductors are connected in parallel, simulations have shown that while the inductance may be decreased, the resistance will be decreased at a greater amount than the decrease in inductance. For example, the resistance can, for example, be decreased to approximately 50% of its original value. Therefore, the inductance would be decreased by less than 50% of its original value. Since the corresponding decrease in resistance is greater than the corresponding decrease in inductance, the overall Q value would be increased.

Furthermore, as shown in FIG. 37, metal fillings 32 are connected in parallel with metal fillings 8, while metal fillings 36 are connected in parallel with metal fillings 34. Since the metal fillings 32 are connected in parallel, the overall resistance of the metal fillings in inductor 2 is reduced. Since the resistance in inductor 2 is reduced, the Q factor is increased through metal fillings 32 being connected in parallel with metal fillings 8 and metal fillings 36 being connected in parallel with metal fillings 34.

What is claimed is:

1. A method for producing an inductor comprising the steps of:
   providing a first substrate having a first side and a second side opposing the first side of the first substrate;
   forming a first plurality of vias in the first substrate;
   filling the first plurality of vias in the first substrate with a first plurality of metal fillings;
   forming a first plurality of metal conductors on the first side of the first substrate;
   connecting pairs of the first plurality of metal fillings together using the first plurality of metal conductors;
   providing a second substrate having a first side and a second side opposing the first side of the second substrate;
   forming a second plurality of vias in the second substrate;
   filling the second plurality of vias in the second substrate with a second plurality of metal fillings;
   forming a second plurality of metal conductors on the first side of the second substrate;
   connecting pairs of the second plurality of metal fillings together using the second plurality of metal conductors;
   bonding the second side of the first substrate with the second side of the second substrate after performing the step of filling the second plurality of vias in the second substrate with the second plurality of metal fillings; and
   connecting the first plurality of metal fillings to the second plurality of metal fillings to form a spiral.

2. The method of claim 1 further comprising the step of bonding the first plurality of metal fillings to the second plurality of metal fillings using gold thermocompression bonding.

3. The method of claim 1 further comprising the step of plating metal into photoresist molds to form the first plurality of metal conductors and the second plurality of metal conductors.

4. The method of claim 1 further comprising the steps of:
   forming a first plurality of trenches within the first side of the first substrate;
   forming a first insulating layer within the first plurality of trenches;
   forming the first plurality of metal conductors on top of the first insulating layer within the first plurality of trenches;
   forming a second plurality of trenches within the first side of the second substrate;
   forming a second insulating layer within the second plurality of trenches; and
   forming the second plurality of metal conductors on top of the second insulating layer within the second plurality of trenches.

5. The method of claim 4 further comprising the step of increasing a winding density of the spiral by forming each of the first plurality of trenches and each of the second plurality of trenches with a depth to spacing aspect ratio equal to or greater than 2:1.

6. The method of claim 4 further comprising the step of forming the first plurality of trenches and the second plurality of trenches with deep reactive ion etching using a time sequenced etch and passivation process.

7. The method of claim 1 wherein the first plurality of metal fillings and the second plurality of metal fillings are formed in a rectangular cross section shape to reduce resistance within the first plurality of metal fillings and the second plurality of metal fillings.

8. The method of claim 1 wherein the first plurality of metal fillings and the second plurality of metal fillings are formed in an oval cross section shape to reduce resistance within the first plurality of metal fillings and the second plurality of metal fillings.

9. A method for producing an inductor comprising the steps of:
   forming a first plurality of vias in a first substrate;
   filling the first plurality of vias in the first substrate with a first plurality of metal fillings;
   forming a first plurality of trenches within the first substrate;
   forming a first insulating layer within the first plurality of trenches;
   forming a first plurality of metal conductors on top of the first insulating layer within the first plurality of trenches;
   connecting pairs of the first plurality of metal fillings together using the first plurality of metal conductors to form a spiral;
   forming a second plurality of vias in a second substrate;
   filling the second plurality of vias in the second substrate with a second plurality of metal fillings;
   forming a second plurality of trenches within the second substrate;
   forming a second insulating layer within the second plurality of trenches;
   forming a second plurality of metal conductors on top of the second insulating layer within the second plurality of trenches;
   connecting pairs of the second plurality of metal fillings together using the second plurality of metal conductors; and
   connecting the first plurality of metal fillings to the second plurality of metal fillings to form the spiral.

10. The method of claim 9 further comprising the step of bonding the first plurality of metal fillings to the second plurality of metal fillings using gold thermocompression bonding.

11. The method of claim 9 further comprising the step of plating metal into photoresist molds to form the first plurality of metal conductors and the second plurality of metal conductors.

12. The method of claim 9 further comprising the step of increasing a winding density of the spiral by forming each of the first plurality of trenches and each of the second plurality of trenches with a depth to spacing aspect ratio equal to or greater than 2:1.

13. The method of claim 9 further comprising the step of forming the first plurality of trenches and the second plurality of trenches with deep reactive ion etching using a time sequenced etch and passivation process.

14. The method of claim 9 wherein the first plurality of metal fillings and the second plurality of metal fillings are formed in a rectangular cross section shape to reduce resistance within the first plurality of metal fillings and the second plurality of metal fillings.

15. The method of claim 9 wherein the first plurality of metal fillings and the second plurality of metal fillings are formed in an oval cross section shape to reduce resistance within the first plurality of metal fillings and the second plurality of metal fillings.

16. A method for producing an inductor comprising the steps of:
- providing a first substrate having a first side and a second side opposing the first side of the first substrate;
- forming a first plurality of vias in the first substrate;
- filling the first plurality of vias in the first substrate with a first plurality of metal fillings;
- forming a first plurality of metal conductors on the first side of the first substrate;
- connecting pairs of the first plurality of metal fillings together using the first plurality of metal conductors;
- providing a second substrate having a first side and a second side opposing the first side of the second substrate;
- forming a second plurality of vias in the second substrate;
- filling the second plurality of vias in the second substrate with a second plurality of metal fillings;
- forming a second plurality of metal conductors on the first side of the second substrate;
- connecting pairs of the second plurality of metal fillings together using the second plurality of metal conductors;
- bonding the second side of the first substrate with the second side of the second substrate, the bonded second substrate formed with the second plurality of vias that are filled with the second plurality of metal fillings; and
- connecting the first plurality of metal fillings to the second plurality of metal fillings to form a spiral.

* * * * *